US009638922B2

(12) United States Patent
Anikitchev

(10) Patent No.: US 9,638,922 B2
(45) Date of Patent: May 2, 2017

(54) HIGH-EFFICIENCY LINE-FORMING OPTICAL SYSTEMS AND METHODS

(71) Applicant: Ultratech, Inc., San Jose, CA (US)

(72) Inventor: Serguei Anikitchev, Belmont, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 15/191,941

(22) Filed: Jun. 24, 2016

(65) Prior Publication Data

US 2016/0306177 A1   Oct. 20, 2016

Related U.S. Application Data

(62) Division of application No. 14/744,207, filed on Jun. 19, 2015, now Pat. No. 9,411,163.

(Continued)

(51) Int. Cl.
*H01L 21/428* (2006.01)
*G02B 27/09* (2006.01)
(Continued)

(52) U.S. Cl.
CPC ...... *G02B 27/0927* (2013.01); *B23K 26/0006* (2013.01); *B23K 26/0066* (2013.01); *B23K 26/066* (2015.10); *B23K 26/0643* (2013.01); *B23K 26/0648* (2013.01); *B23K 26/0738* (2013.01); *B23K 26/082* (2015.10);
(Continued)

(58) Field of Classification Search
CPC ............... H01L 21/268; H01L 21/2683; H01L 21/3242; H01L 21/428; H01L 21/477; G02B 27/0927; G02B 27/0988; B23K 26/0066; B23K 26/0087; B23K 26/06; B23K 26/0643; B23K 26/0648;
(Continued)

(56) References Cited

U.S. PATENT DOCUMENTS 2,970,518 A  2/1961 Ross
3,674,334 A  7/1972 Offner
(Continued)

FOREIGN PATENT DOCUMENTS

JP  2008-053459 A  3/2008
JP  2010-103177 A  5/2010
JP  2010-141345 A  6/2010

OTHER PUBLICATIONS

Office Action of Jan. 31, 2017, for Japanese Patent Application JP2015-118041, which is the Japanese counterpart application to the above-identified application.

*Primary Examiner* — Stephen W Smoot
(74) *Attorney, Agent, or Firm* — Opticus IP Law PLLC

(57) ABSTRACT

A line-forming optical system and method are disclosed that form a line image with high-efficiency. A method includes forming a laser beam having a first intensity profile with a Gaussian distribution in at least a first direction and passing at least 50% of the laser beam in the first direction to form a first transmitted light. The method also includes: focusing the first transmitted light at an intermediate image plane to define a second intensity profile having a central peak and first side peaks immediately adjacent the central peak; then truncating the second intensity profile within each of first side peaks to define a second transmitted light; and then forming the line image at an image plane from the second transmitted light.

10 Claims, 6 Drawing Sheets

Related U.S. Application Data

(60) Provisional application No. 62/030,391, filed on Jul. 29, 2014.

(51) Int. Cl.

| | | |
|---|---|---|
| *B23K 26/00* | (2014.01) | |
| *H01L 21/324* | (2006.01) | |
| *H01L 21/322* | (2006.01) | |
| *G02B 17/06* | (2006.01) | |
| *H01L 21/477* | (2006.01) | |
| *B23K 26/06* | (2014.01) | |
| *B23K 26/073* | (2006.01) | |
| *B23K 26/08* | (2014.01) | |
| *B23K 26/354* | (2014.01) | |
| *B23K 26/352* | (2014.01) | |
| *B23K 26/066* | (2014.01) | |
| *B23K 26/082* | (2014.01) | |
| *G02B 17/00* | (2006.01) | |
| *H01L 21/225* | (2006.01) | |
| *H01L 21/268* | (2006.01) | |
| *B23K 103/00* | (2006.01) | |
| *B23K 101/40* | (2006.01) | |

(52) U.S. Cl.
 CPC ........ *B23K 26/083* (2013.01); *B23K 26/0823* (2013.01); *B23K 26/352* (2015.10); *B23K 26/354* (2015.10); *G02B 17/008* (2013.01); *G02B 17/061* (2013.01); *G02B 27/0983* (2013.01); *G02B 27/0988* (2013.01); *H01L 21/2253* (2013.01); *H01L 21/268* (2013.01); *H01L 21/322* (2013.01); *H01L 21/324* (2013.01); *H01L 21/428* (2013.01); *H01L 21/477* (2013.01); *B23K 2201/40* (2013.01); *B23K 2203/56* (2015.10)

(58) Field of Classification Search
 CPC B23K 26/066; B23K 26/0738; B23K 26/082; B23K 26/0853
 See application file for complete search history.

(56) References Cited

U.S. PATENT DOCUMENTS

| | | |
|---|---|---|
| 3,980,397 A | 9/1976 | Judd et al. |
| 4,158,176 A | 6/1979 | Hunt et al. |
| 4,234,356 A | 11/1980 | Auston et al. |
| 4,375,993 A | 3/1983 | Mori et al. |
| 4,605,606 A | 8/1986 | Ferrante |
| 4,832,446 A * | 5/1989 | Miyagawa ............ G02B 26/127 359/559 |
| 5,331,466 A | 7/1994 | Van Saarloos |
| 5,401,666 A | 3/1995 | Tsukamoto |
| 5,612,251 A | 3/1997 | Lee |
| 5,767,003 A | 6/1998 | Noguchi |
| 5,803,965 A | 9/1998 | Yoon |
| 5,908,307 A | 6/1999 | Talwar et al. |
| 5,930,617 A | 7/1999 | Wu |
| 5,959,779 A | 9/1999 | Yamazaki et al. |
| 6,066,516 A | 5/2000 | Miyasaka |
| 6,281,057 B2 | 8/2001 | Aya et al. |
| 6,303,476 B1 | 10/2001 | Hawryluk et al. |
| 6,335,509 B1 | 1/2002 | Jung |
| 6,365,476 B1 | 4/2002 | Talwar et al. |
| 6,366,308 B1 | 4/2002 | Hawryluk et al. |
| 6,368,947 B1 | 4/2002 | Yu |
| 6,383,956 B2 | 5/2002 | Hawryluk et al. |
| 6,479,821 B1 | 11/2002 | Hawryluk et al. |
| 6,514,339 B1 | 2/2003 | Jung |
| 6,521,501 B1 | 2/2003 | Erhardt et al. |
| 6,524,977 B1 | 2/2003 | Yamazaki et al. |
| 6,531,681 B1 | 3/2003 | Markle et al. |
| 6,548,361 B1 | 4/2003 | En et al. |
| 6,558,991 B2 | 5/2003 | Yamazaki et al. |
| 6,632,749 B2 | 10/2003 | Miyasaka et al. |
| 6,676,260 B2 | 1/2004 | Cobb et al. |
| 6,678,308 B1 | 1/2004 | Matthews |
| 6,693,257 B1 | 2/2004 | Tanaka |
| 6,730,550 B1 | 5/2004 | Yamazaki et al. |
| 6,747,245 B2 | 6/2004 | Talwar et al. |
| 6,974,731 B2 | 12/2005 | Yamazaki et al. |
| 6,987,240 B2 | 1/2006 | Jennings et al. |
| 7,005,601 B2 | 2/2006 | Jennings |
| 7,098,155 B2 | 8/2006 | Talwar et al. |
| 7,110,171 B2 | 9/2006 | Dane et al. |
| 7,140,737 B2 | 11/2006 | Kim et al. |
| 7,245,376 B2 | 7/2007 | Liphardt et al. |
| 7,279,721 B2 | 10/2007 | Jennings et al. |
| 7,304,005 B2 | 12/2007 | Yamakazi et al. |
| 7,394,594 B2 | 7/2008 | Gardner et al. |
| 7,423,818 B2 | 9/2008 | Hemenway et al. |
| 7,482,254 B2 | 1/2009 | Bakeman |
| 7,494,942 B2 | 2/2009 | Talwar et al. |
| 7,510,920 B2 | 3/2009 | Yamakazi et al. |
| 7,595,208 B2 | 9/2009 | Jennings et al. |
| 7,618,882 B2 | 11/2009 | Tanaka et al. |
| 7,737,054 B2 | 6/2010 | Yamakazi et al. |
| 7,847,213 B1 * | 12/2010 | Anikitchev ............ B23K 26/06 219/121.61 |
| 8,014,427 B1 | 9/2011 | Anikitchev |
| 8,320,056 B2 | 11/2012 | Erlandson |
| 8,785,815 B2 | 7/2014 | Sade et al. |
| 2002/0048864 A1 | 4/2002 | Yamazaki et al. |
| 2004/0084427 A1 | 5/2004 | Talwar et al. |
| 2004/0150887 A1 * | 8/2004 | Hirai ............ G02B 27/09 359/626 |
| 2012/0105945 A1 * | 5/2012 | Erlandson .......... G02B 27/0966 359/337.2 |
| 2016/0148810 A1 * | 5/2016 | Hawryluk ........ B23K 26/0626 438/798 |

* cited by examiner

HIGH-EFFICIENCY LINE-FORMING OPTICAL SYSTEMS AND METHODS

CLAIM OF PRIORITY

This application is a divisional application of U.S. patent application Ser. No. 14/744,207, filed on Jun. 19, 2015, now U.S. Pat. No. 9,411,163 which is incorporated by reference herein and which claims priority under 35 USC 119(e) from U.S. Provisional Patent Application No. 62/030,301, filed on Jul. 29, 2014, and which is incorporated by reference herein.

FIELD

The present disclosure relates to optical systems for forming a line image, and in particular relates to high-efficiency line-forming optical systems and methods.

The entire disclosure of any publication or patent document mentioned herein is incorporated by reference, including U.S. Pat. No. 8,014,427.

BACKGROUND

A variety of applications require the use a uniform line image formed from a high-power laser beam. One such application is laser thermal processing (LTP), also referred to in the art as laser spike annealing (LSA) or just "laser annealing," which is used in semiconductor manufacturing to activate dopants in select regions of a semiconductor wafer when forming active microcircuit devices such as transistors.

One type of laser annealing uses a scanned line image formed from a laser beam to heat the surface of the semiconductor wafer to a temperature (the "annealing temperature") for a time long enough to activate the dopants but short enough to minimize dopant diffusion. The time that the surface of semiconductor wafer is at the annealing temperature is determined by the power density of the line image, as well as by the line-image width divided by the velocity at which the line image is scanned (the "scan velocity").

One type of high-power laser that is used for laser annealing applications is $CO_2$ laser. Traditional methods of performing laser annealing with a $CO_2$ laser including imaging the laser beam onto a pair of knife-edges and then relaying the laser beam passing therethrough to an image plane to form the line image. The knife-edges are positioned to transmit only a narrow central portion (e.g., 10%) of a Gaussian laser beam for which the intensity is relatively uniform so that the resulting line image is also relatively uniform along the length of the line image.

Unfortunately, using only the narrow central portion of the laser beam means that the other 90% of the light beam is rejected. This is a very inefficient use of the high-intensity laser beam. On the other hand, the conventional wisdom is that trying to pass a larger portion of the Gaussian beam will naturally result in non-uniformity of the line image along its length because of the substantial drop off in intensity in the Gaussian beam with distance from the center of the beam.

SUMMARY

An aspect of the disclosure is a line-forming optical system having an object plane and image plane and that forms a line image at the image plane. The system includes: a laser source that emits an initial laser beam; a beam-conditioning optical system that receives the initial laser beam and forms therefrom a conditioned laser beam having a first intensity profile with a Gaussian distribution in at least a first direction; a first aperture device operably disposed at the object plane and that defines a first slit aperture that truncates the first intensity profile in the first direction to define a first transmitted light that constitutes at least 50% of the conditioned laser beam; a relay optical system that defines the object and image planes and that also defines an intermediate image plane at which is operably disposed a second aperture device, the relay optical system defining at the intermediate image plane a second intensity profile having a central peak and first side peaks immediately adjacent the central peak, wherein the second aperture device is configured to truncate the second intensity profile in the first direction and within each of the first side peaks to define a second transmitted light; and wherein the relay optical system forms the line image at the image plane from the second transmitted light.

Another aspect of the disclosure is the line-forming optical system as described above, each first side peak is preferably defined by a maximum value MX and first and second minimum values m1 and m2. The second aperture device preferably defines a second slit aperture. The second slit aperture is preferably configured to truncate the second intensity profile between the maximum value MX and the second minimum value m2 in each first side peak.

Another aspect of the disclosure is the line-forming optical system as described above, the relay optical system preferably has substantially 1× magnification in the first direction.

Another aspect of the disclosure is the line-forming optical system as described above, the relay optical system is preferably a cylindrical optical system having optical power only in the first direction.

Another aspect of the disclosure is the line-forming optical system as described above, the line image preferably has a length L in the range of 5 mm≤L≤100 mm and preferably has an intensity uniformity of within +/−5% over the length L.

Another aspect of the disclosure is the line-forming optical system as described above, the relay optical system preferably consists of reflective optical components only.

Another aspect of the disclosure is the line-forming optical system as described above, the laser source preferably has an operating wavelength of nominally 10.6 µm.

Another aspect of the disclosure is the line-forming optical system as described above, the first aperture device preferably comprises a pair of blades operably disposed in the object plane.

Another aspect of the disclosure is the line-forming optical system as described above, the second aperture device preferably comprises a pair of blades operably disposed in the intermediate image plane.

Another aspect of the disclosure is the line-forming optical system as described above, the line image preferably has a length L that is in the range of 5 mm≤L≤100 mm and preferably has a width w in the range of 25 µm≤w≤500 µm.

Another aspect of the disclosure is a laser annealing system for annealing a wafer having a surface. The laser annealing system includes: the line-forming optical system as described above, wherein the line image has a long dimension defined by the length L; and a stage configured to operably support and move the wafer in the image plane so as to scan the line image over the surface of wafer in a scan direction to anneal the surface of wafer, wherein the scan direction is perpendicular to the long dimension of the line image.

Another aspect of the disclosure is the laser annealing system as described above, the surface of wafer preferably includes device features that include dopants, and the annealing of the surface of wafer preferably activates the dopants.

Another aspect of the disclosure is a method of forming a line image. The method includes: forming a laser beam having a first intensity profile with a Gaussian distribution in at least a first direction, and passing at least 50% of the laser beam in the first direction to form a first transmitted light. The method also includes: focusing the first transmitted light at an intermediate image plane to define a second intensity profile having a central peak and first side peaks immediately adjacent the central peak, truncating the second intensity profile within each of first side peaks to define a second transmitted light; and forming the line image at an image plane from the second transmitted light.

Another aspect of the disclosure is the method as described above, each first side peak is preferably defined by a maximum value MX and first and second minimum values m1 and m2. Truncating the second intensity profile is preferably performed between the maximum value MX and the second minimum value m2 in each of the first side peaks.

Another aspect of the disclosure is the method as described above, the intermediate image plane is preferably defined by a relay optical system. The relay optical system preferably has substantially 1× magnification in the first direction.

Another aspect of the disclosure is the method as described above, the relay optical system preferably comprises cylindrical mirrors.

Another aspect of the disclosure is the method as described above, the line image preferably has a length L in the range of 5 mm≤L≤100 mm and preferably has an intensity uniformity of within +/−5% over the length L.

Another aspect of the disclosure is the method as described above, the relay optical system preferably consists of reflective optical components only.

Another aspect of the disclosure is the method as described above, truncating the second intensity profile preferably includes passing a central portion of the first transmitted light through a slit aperture defined by a pair of blades.

Another aspect of the disclosure is the method as described above, the line image preferably has a length L that is in the range of 5 mm≤L≤100 mm and preferably has a width w in the range of 25 μm≤w≤500 μm.

Another aspect of the disclosure is the method as described above, the line image preferably has a long dimension defined by the length L, and preferably further includes scanning the line image over a surface of a wafer in a scan direction that is perpendicular to the long dimension.

Another aspect of the disclosure is the method as described above, the surface of wafer preferably includes device features that include dopants. Scanning the line image over the surface of wafer preferably activates the dopants.

Another aspect of the disclosure is a line-forming optical system having an object plane and image plane and that forms a line image at the image plane. The line-forming optical system includes: a laser source system that emits a laser beam having a first intensity profile that is elongate in a first direction and that has a Gaussian distribution in the first direction, a first aperture device operably arranged to truncate the laser beam in the first direction to transmit at least 50% of a central portion of the laser beam, and a relay optical system having an intermediate image plane at which is operably disposed a second aperture device, the relay optical system having a first optical component that defines at the intermediate image plane a second intensity profile that is elongate in the first direction and having a central peak and first side peaks immediately adjacent the central peak, wherein the second aperture device is configured to truncate the second intensity profile within each of first side peaks to define a second transmitted light. The relay optical system has a second optical component that forms the line image at the image plane from the second transmitted light.

Another aspect of the disclosure is the line-forming optical system as described above, the first and second optical components are preferably reflective.

Another aspect of the disclosure is the line-forming optical system as described above, each of the first and second aperture devices comprises a pair of blades.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this

DETAILED DESCRIPTION

Cartesian coordinates are shown in some of the Figures for the sake of reference and are not intended to be limiting as to direction or orientation. Further, the Cartesian coordinates at a second aperture device 60 are denoted x' and y' to distinguish from the (x,y) coordinates at a first aperture device 40 and at an image plane IP.

In the discussion below, the terms "laser beam" and "light" are used interchangeably.

The terms "upstream" and "downstream" are used to refer to the location of an item relative to direction of light travel as conventionally used in the art of optical system design, wherein when item B is said to be downstream of item A, light travels in the direction from item A to item B, and vice versa.

Figure 1:
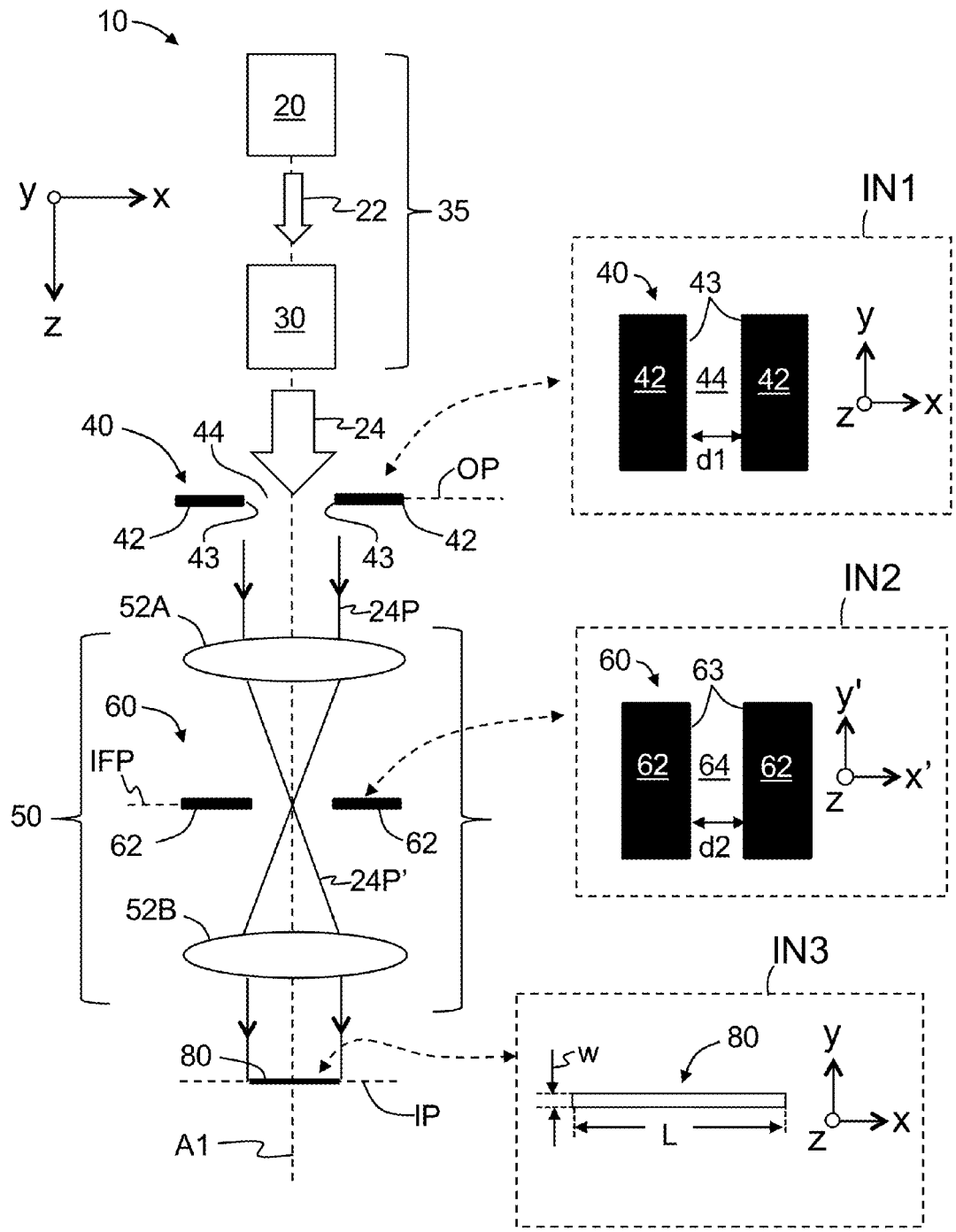
FIG. 1 is a schematic diagram of an example line-forming optical system according to the disclosure.

FIG. 1 is a schematic diagram of an example line-forming optical system ("system") 10 according to the disclosure. The system 10 includes an optical axis A1, an object plane OP and an image plane IP at which a line image 80 is formed as described below.

The system 10 includes along the optical axis A1 and upstream from the object plane OP a laser source 20 that emits an initial laser beam 22 along the optical axis A1 towards the object plane OP. In an example, the laser source 20 includes a $CO_2$ laser that operates at a nominal wavelength of 10.6 µm. In an example, the initial laser beam 22 has a Gaussian intensity distribution (profile) at along least the x-direction, and further in an example in both the x-direction and the y-direction. In an example, the initial laser beam 22 need not be circularly symmetric, e.g., the Gaussian intensity distributions in the x-direction and y-direction can have different sizes.

The system 10 also includes a beam-conditioning optical system 30 arranged along the optical axis A1 between the laser source 20 and the object plane OP. The beam-conditioning optical system 30 is configured to receive the initial laser beam 22 and form therefrom a conditioned laser beam 24. In an example, the beam-conditioning optical system 30 is configured to perform beam expansion so that the conditioned laser beam 24 is an expanded version of the initial laser beam 22. In an example, the beam-conditioning optical system 30 is configured to provide the conditioned laser beam 24 with a select dimensions (profiles) in the x-direction and the y-direction. In an example, the beam-conditioning optical system 30 expands the dimensions of initial laser beam 22 by the same amount in the x-direction and the y-direction.

The beam-conditioning optical system 30 can include at least one of mirrors, lenses, apertures, and like optical components. An example beam-conditioning optical system 30 utilizes two or more off-axis mirrors each having optical power such as known in the art and two examples of which are described in U.S. Pat. Nos. 2,970,518 and 3,674,334. In various examples, the beam-conditioning optical system 30 can be anamorphic, cylindrical or circularly symmetric.

In an example embodiment, the laser source 20 and the beam-conditioning optical system 30 define a laser source system 35 that generates the desired intensity profile I(x,y) for the conditioned laser beam 24 for forming the line image 80. In an example where the laser source 20 emits a suitable initial laser beam 22 that does not need to be conditioned, then the beam-conditioning optical system 30 is not required and the initial laser beam 22 can be used in place of a conditioned laser beam 24. Thus, in the discussion below, the conditioned laser beam 24 is understood in an example to be defined by an unprocessed initial laser beam 22.

The system 10 also includes along the optical axis A1 and at the object plane OP a first aperture device 40. In an example, the first aperture device 40 is includes a pair of blades 42 each having an edge 43. The blades 42 are disposed in the object plane OP on respective sides of the optical axis A1 so that their respective edges 43 are opposing and spaced apart to form a slit aperture 44. The slit aperture 44 has its long dimension in the Y-direction, as best seen in the close-up inset IN1, which shows the first aperture device 40 as at appears looking down the optical axis A1 in the +z direction. The slit aperture 44 has a width d1 in the x-direction that defines a length L of the line image 80 formed by the system 10 at the image plane IP, as described below. In an example, the blades 42 are movable to adjust the width d1 and thus the length L of line image 80.

The system 10 also includes the optical axis A1 and downstream of the first aperture device 40 a relay optical system 50. The relay optical system 50 shown in FIG. 1 is shown as a transmission optical system for ease of illustration. An example of a reflective relay optical system 50 is described below in connection with FIG. 5. The relay optical system 50 includes first and second optical components 52A and 52B. In example, each optical component 52A and 52B can consist of one or more optical elements, such as lenses, mirrors, etc. The relay optical system 50 defines the object plane OP at the first aperture device 40 resides and also defines the image plane IP at which the line image 80 is formed.

The relay optical system 50 further includes a second aperture device 60 arranged between first and second optical components 52A and 52B at an intermediate focal plane IFP defined by the first optical component 52A. With reference to the second close-up inset IN2, the second aperture device 60 includes a pair of blades 62 each having an edge 63. The blades 62 are disposed in the intermediate focal plane IFP on respective sides of the optical axis A1 so that their respective edges 63 are opposing and spaced apart to form a slit aperture 64. The slit aperture 64 has its long dimension in the y'-direction, i.e., in the same direction as the slit aperture 44 of the first aperture device 40. The slit aperture 64 has a width d2 in the x'-direction. In an example, the blades 62 are movable to adjust the width d2.

In an example embodiment, the relay optical system 50 has substantially unit magnification (i.e., is substantially a 1× system) in the x-z plane. Also in examples, the relay optical system 50 can be either cylindrical or anamorphic. The width d1 of slit aperture 44 of first aperture device 40 defines the size of conditioned laser beam 24 in the x-direction, and for 1× magnification in the x-z plane, d1=L (see close-up inset IN3).

Figure 2A:
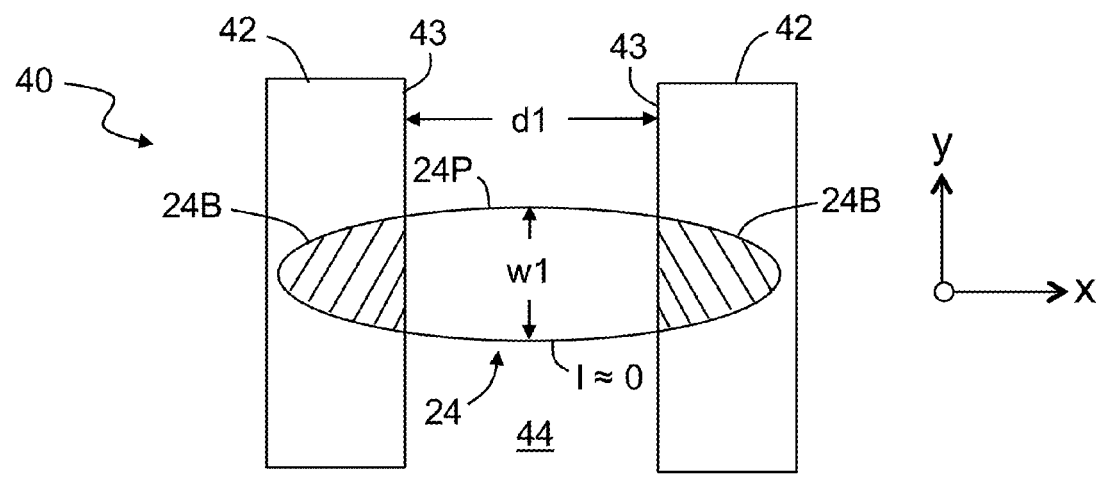
FIG. 2A is a front-on view of the first aperture device of the example line-forming optical system of FIG. 1 as seen looking in the +z direction and shows the approximate zero-intensity contour (I(x,y)≈0) of the conditioned laser beam as it is incident up the first aperture device.

In the general operation of system 10, the conditioned laser beam 24 is formed and the first aperture device 40 is configured so that a relatively large amount of the light in this beam passes through the slit aperture 44. FIG. 2A is a front-on view of the first aperture device 40 (looking in the +z direction) and shows the approximate zero-intensity profile (I(x,y)≈0) of conditioned laser beam 24. In an example, the conditioned laser beam 24 has a Gaussian profile in the x-direction and y-direction, with the profile being longer in the x-direction (i.e., the intensity profile I(x,y) is elongate in the x-direction). As noted above, the width w1 of the Gaussian profile in the y-direction defines the width w (short dimension) of line image 80. In an example, the width w1 is defined by the beam-conditioning optical system 30, with the relay optical system 50 having no optical power in the y-z plane (i.e., the relay optical system 50 is cylindrical with optical power in the x-z plane only). This is one advantage of using a beam-conditioning optical system 30, since it avoids having to form optical components 52A and 52B using anamorphic elements.

Figure 2B:
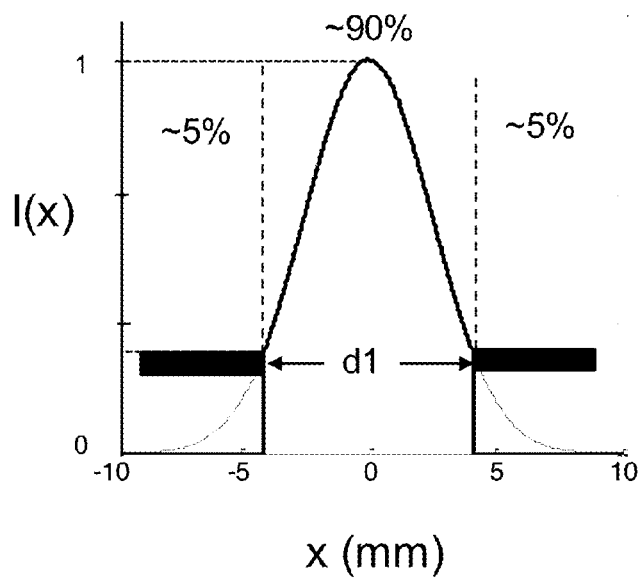
FIG. 2B is a plot of the intensity profile I(x) versus x (mm) of the conditioned laser beam and shows the location of the opposing blades of first aperture device relative to the conditioned laser beam.

FIG. 2B is a plot of the intensity profile I(x) versus x (mm) of conditioned laser beam 24 that also shows an example location of the blades 42 of first aperture device 40 relative to the conditioned laser beam 24. The hashed portions 24B of conditioned laser beam 24 in FIG. 2A shows the portions of the conditioned laser beam 24 that are block by the respective blades 42, while the portion that passes through the slit aperture 44 is denoted 24P, which is also referred to below as "first transmitted light." This is also illustrated in FIG. 2B, wherein the dashed-line portion of the intensity profile I(x) shows the portion of the light that is blocked by the respective blades 42. In the example illustrated in FIGS. 2A and 2B, about 90% of the light in the conditioned laser beam 24 passes through the slit aperture 44 as the first transmitted light 24P, while about 10% of the light of conditioned laser beam 24 at the wings of the intensity profile is blocked by the blades 42. In an example, the first aperture device 40 is configured to pass at least 50% of the conditioned laser beam 24.

Because the first aperture device 40 is configured to pass a substantial portion of the conditioned laser beam 24, the variation in intensity profile I(x) within the slit aperture 44 is relative large. In an example, this variation greater than 50% while in another example is greater than 65% while in another example is greater than 70%. This can be seen most clearly in FIG. 2B, wherein the (normalized) peak intensity is 1 in the center of slit aperture 44 (i.e., at x=0) while the intensity drops off to about 0.28, i.e., to about 28% of the maximum value of intensity profile I(x) at the edges of slit aperture 44 as defined by the edges 43 of blades 42. If this intensity profile I(x) is relayed to the image plane IP using convention relay means, the line image 80 will have a corresponding variation in intensity uniformity (about 72%) in the long direction. This is far greater than the preferred intensity uniformity of within +/−5% or in some cases within +/−2%, over the length L of line image 80.

With reference again to FIG. 1, the first transmitted light 24P that passes through the slit aperture 44 is focused onto the second aperture device 60 at the intermediate focal plane IFP by the first optical component 52A of relay optical system 50. The intermediate focal plane IFP has coordinates x' and y' to distinguish from the (x,y) coordinates at the first aperture device 40. This focusing gives rise to a second intensity profile I'(x',y'), which is defined by the 1-dimensional Fourier transform (in the x'-direction) of the intensity profile I(x,y) at the object plane OP.

The intensity profile I(x) at the object plane OP can be defined as (with (d1)/2=a):

$$I(x) = G(x) \cdot \text{rect}(x/a)$$

where rect (x/a) is: 0 for |x|>a; ½ for x=a; and 1 for |x|<a, and $G(x) = \exp(-x^2)$. Thus, I'(x') is given by:

$$I'(x') = F\{I(x)\} = F\{\text{rect}(x/a) \cdot \exp(-x^2)\} = [a \cdot \text{sinc}(x' \cdot a/2)]$$
$$\ast [(\pi)^{1/2} \exp\{-\pi^2 x'^2\}]$$

where the ⊠ symbol represents the convolution operation.

Figure 3A:
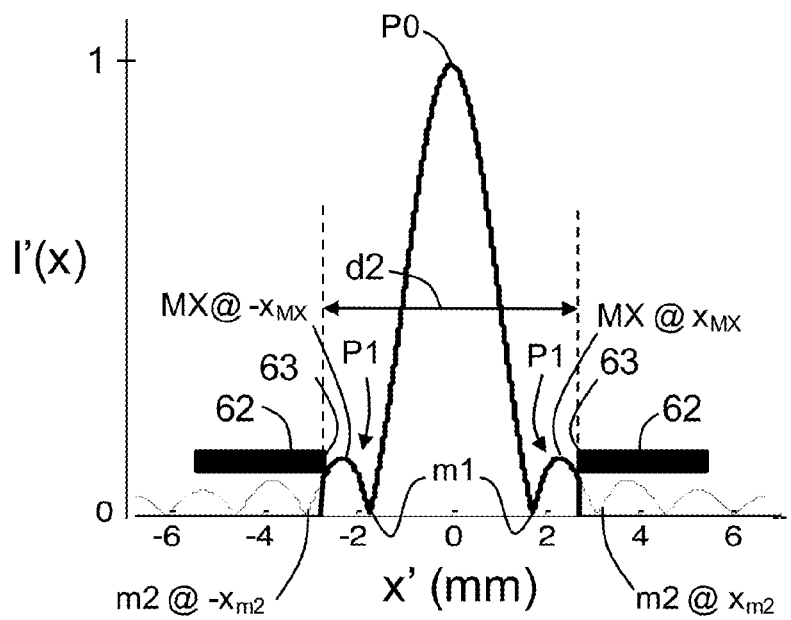
FIG. 3A is a plot of intensity profile I'(x') vs. x' (mm) of the first transmitted light at the second aperture device, and shows an example position of the opposing second aperture blades of the second aperture device relative to the intensity profile.
Figure 3B:
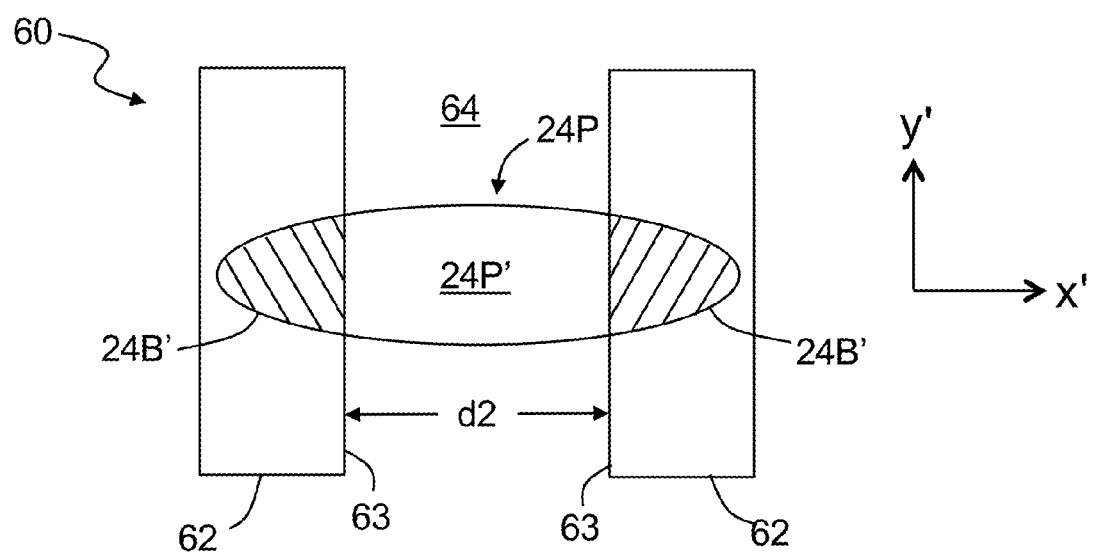
FIG. 3B is a front-on view of the second aperture device of FIG. 3A as looking in the +z direction in FIG. 1 and showing the first transmitted light incident thereon.

FIG. 3A is a plot of intensity profile I'(x') vs. x' (mm) of the first transmitted light 24P at the second aperture device 60. FIG. 3B is a front-on view of the second aperture device 60 of FIG. 3B as looking in the +z direction. With reference to FIG. 3B, the blades 62 are arranged so that a portion 24P' of the first transmitted light 24P that is incident upon the second aperture device 60 passes through slit aperture 64 while respective portions 24B' of the first transmitted light 24P are block by the blades 62 of second aperture device 60. The portion 24P' of the first transmitted light 24P is thus referred to as "second transmitted light" and is used by the downstream portion of relay optical system 50 to form the line image 80.

FIG. 3A shows details about where the blades 62 can be set to have a select width d2 to pass a select amount of the second transmitted light 24P'. The intensity profile I'(x') shows a strong central peak P0 surrounded by a number smaller peaks that diminish in size from the center of the intensity profile I'(x'). The first peaks on either side of the central peak P0 are denoted P1 and are defined by a maximum value MX surrounded by first and second minimum values (minima) m1 and m2. In an example, the slit aperture 64 is defined to have a width d2 wherein each edge 63 of the blades 62 resides within the corresponding first peak P1 so that the slit aperture 64 transmits at least a portion of the light associated with the first peaks P1.

In another example, the second aperture device 60 is configured so that the edges 63 of blades 62 reside within the corresponding first peak P1 between the maximum value MX and the second minimum m2. For example, if the x-values on the positive side of the x-axis are defined as $x_{MX}$ for the maximum value MX and $x_{m2}$ for the second minimum m2, and the x-position of edge 63 of blades 62 is defined as $x_{63}$, then the condition for the location of edge 63 of the positive-side blade 62 can be expressed as $x_{MX} \le x_{63} \le x_{m2}$. The corresponding condition for the edge 63 on the negative side blade 62 can be expressed as: $-x_{m2} \le -x_{63} \le -x_{MX}$. It has been found that this spatial filtering condition provides the best results forming the line image 80 with an acceptable level of intensity non-uniformity, e.g., to within +/−5% as measured in the long direction over the length L.

In an example, the amount of first transmitted light 24P blocked by the second aperture device 60 at the intermediate focal plane IFP is about 5 to 8% so that about 95 to 92% of the first transmitted light 24P is transmitted to form the second transmitted light 24P'. This allows the relay optical system 50 to form the line image 80 at the image plane IP with an efficiency of up to about 75% relative to the input power or intensity provided to the object plane IP, as compared to the prior art efficiency of about 15%.

Furthermore, the intensity uniformity of line image 80 in the long direction (i.e., the x-direction) can satisfy in one example a tolerance of +/−5% in the long direction over the length L and in another example can satisfy a tolerance of +/−2%.

The line image 80 is formed at the image plane IP using the second transmitted light 24P'. This second transmitted light 24P' in the x-direction is defined as a truncation version of intensity profile I'(x') and can be denoted as follows, wherein F{•} stands for the Fourier transform operation:

$$I'(x') = F\{I(x)\} \cdot rect(x'/b) \text{ where } b = (d2)/2.$$

$$= [a \cdot \text{sinc}(x' \cdot a/2)] \bowtie [(\pi)^{1/2} \exp\{-\pi^2 x'^2\}] \cdot rect(x'/b).$$

The intensity profile IL(x) is then the 1D inverse Fourier transform of I'(x'), i.e., $$IL(x) = F^{-1}\{I'(x')\}.$$

From FIG. 3A, it can be seen that the second aperture device 60 defines the 1D "rect" function in the expression for I'(x') above and serves to remove select amounts of the higher spatial-frequency components along the x' axis. Because these higher spatial-frequency components are needed to form a high-definition line image that includes the intensity variations of the input (conditioned) laser beam 24 at the first aperture device 40, their filtering by the second aperture device 60 acts to smooth out the variation in intensity in the long direction of line image 80. On the other hand, because these higher spatial-frequency components have a relatively low intensity, most of the first transmitted light 24P makes it through the slit aperture 64 to form the second transmitted light 24P'.

Figure 4A:
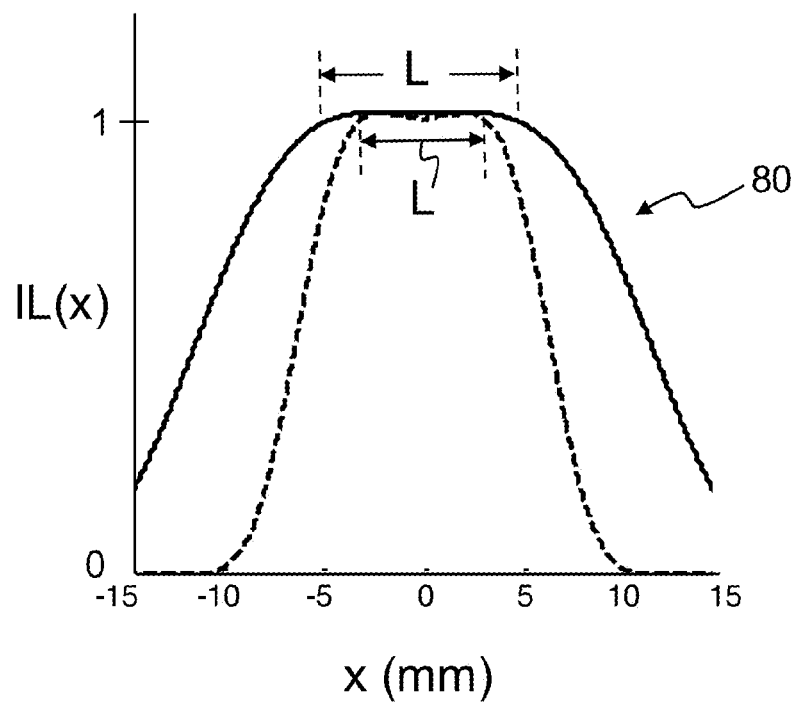
FIG. 4A is a plot of the intensity profile IL(x) vs. x (mm) for the long direction of line image formed at the image plane by the second transmitted light and shows two different example sizes of lines of L=10 mm (solid line) and L=7.5 mm (dashed line) as formed by line-forming optical system of FIG. 1.

FIG. 4A is a plot of the intensity profile IL(x) vs. x (mm) for the long direction of line image 80 at the image plane IP and shows by way of example two different sizes of lines of L=10 mm (solid line) and L=7.5 mm (dashed line) as formed by the system 10. In an example, the length L of line image 80 can be in the range from 5 mm≤L≤100 mm.

Figure 4B:
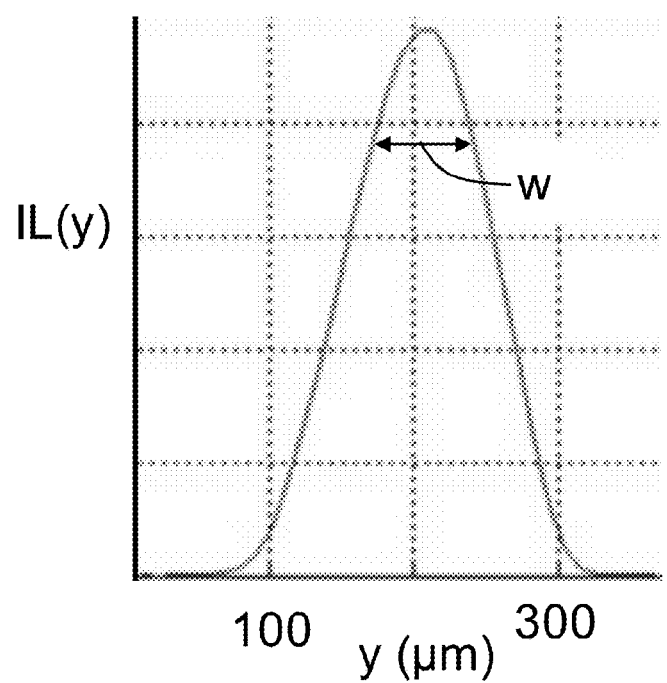
FIG. 4B is a plot of the intensity profile IL(y) vs. y (μm) of the line image and shows that the intensity profile in the short direction (i.e., the y-direction) of the line image has a Gaussian shape that defines an example width w of about 75 µm.

FIG. 4B is a plot of the intensity profile IL(y) vs. y (μm) and shows that the intensity profile IL(y) in the short direction (i.e., y-direction) of line image 80 has a Gaussian shape that defines an example width w of about 75 μm. In an example embodiment, width w can be in the range 25 μm≤w≤500 μm. As noted above, in an example, with width w can be defined by the beam-conditioning optical system 30 so that the relay optical system 50 can be cylindrical with no optical power in the Y-Z plane.

Note that the intensity profile IL(y) in the short dimension for the line image 80 does not need to satisfy the same uniformity tolerance as the intensity profile IL(x) in the long dimension in the case where the line image 80 is scanned in the short direction, i.e., the y-direction. In such a case, the intensity variations in the y-direction average out during scanning. In the plot of intensity profile IL(y) of FIG. 4B, the line image 80 has a variation in intensity in the y-direction of about +/−10%.

Reflective Relay Optical System

Figure 5:
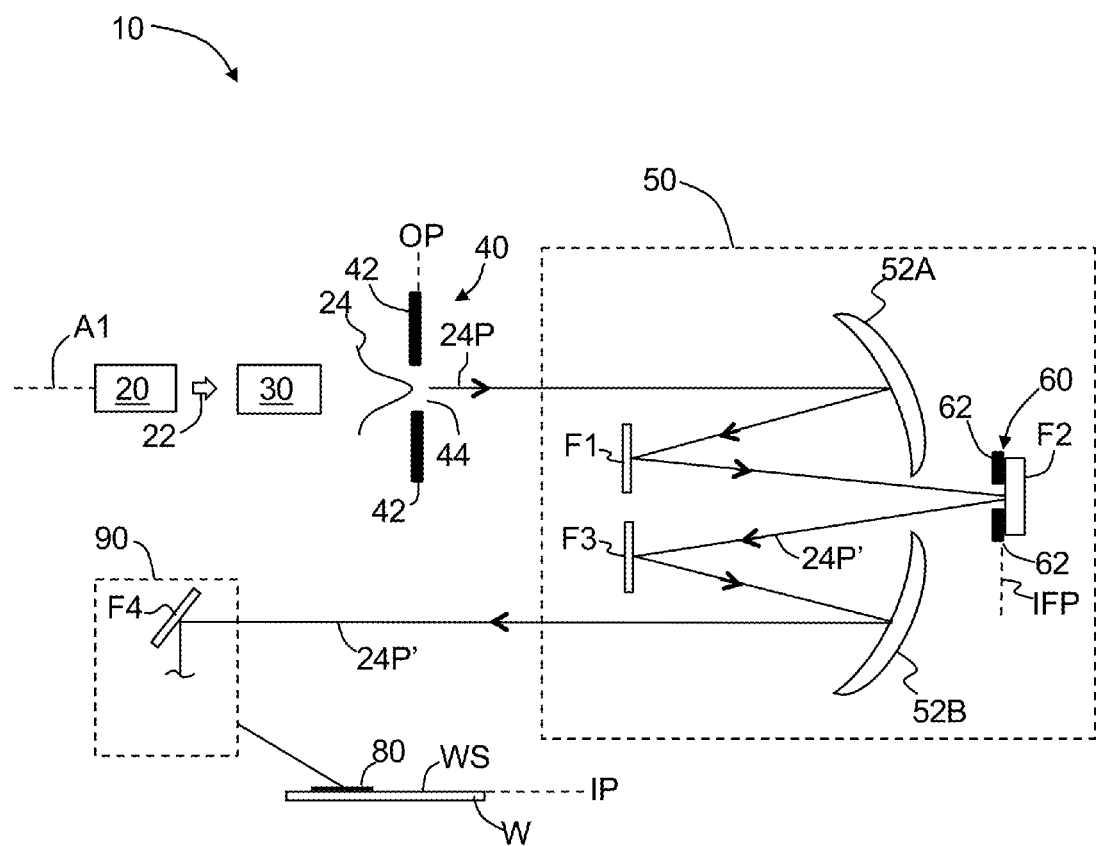
FIG. 5 is a schematic diagram of an example line-forming optical system that includes a reflective relay optical system.

FIG. 5 is a schematic diagram of an example system 10 that includes a reflective relay optical system 50 and a fold-mirror optical system 90 that is used to direct the line image 80 to a surface WS of a wafer W arranged in the image plane IP. The reflective relay optical system 50 includes first and second optical components 52A and 52B in the form of concave mirrors arranged in an off-axis configuration. The relay optical system 50 also includes fold mirrors F1, F2 and F3 that serve to fold the optical path of first transmitted light 24P that passes through the first aperture device 40 at the object plane OP. the fold mirror F2 is arranged behind the second aperture device 60 so that of the first transmitted light 24P incident upon the second aperture device 60, only the center portion of first transmitted light 24P, i.e. the second transmitted light 24P' is reflected by the fold mirror F2 to travel through the remainder of relay optical system 50. Thus, an example relay optical system 50 consists of reflective optical components, i.e., it has no refractive optical components. Such a configuration is desirable when the laser source 20 operates at an infrared wavelength, such as the $CO_2$ laser wavelength of nominally 10.6 μm.

This second transmitted light 24P' is reflected by the fold mirror F3 and directed to the second optical component 52B, which directs the second transmitted light 24P' to the fold-mirror optical system 90 that includes at least one fold mirror F4. In an example, the fold-mirror optical system 90 is configured to compensate for the object plane OP and image plane IP not being parallel so that the line image 80 is properly imaged onto the surface WS of wafer W.

Laser Annealing System

Figure 6:
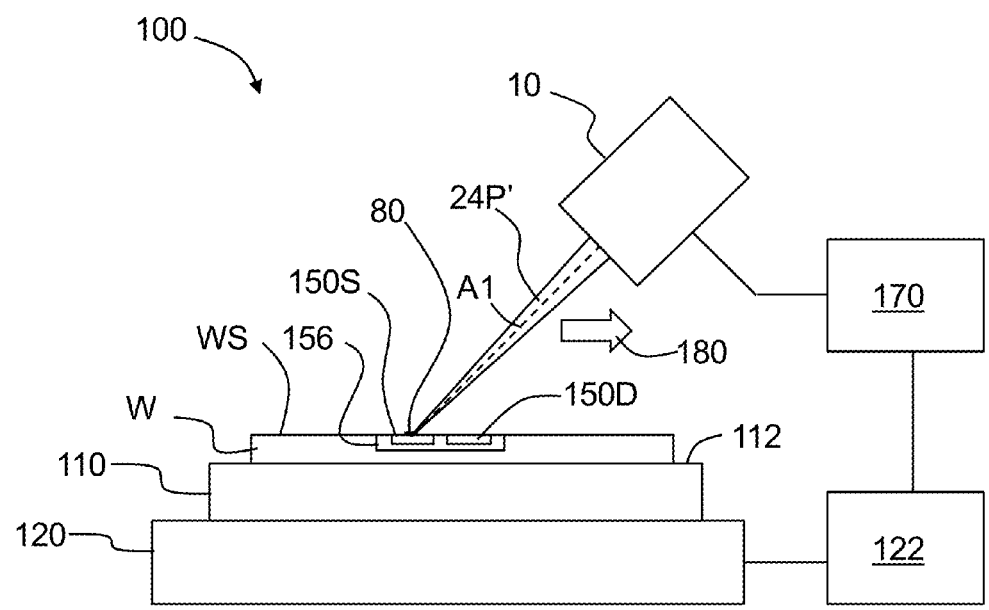
FIG. 6 is a schematic diagram of an example laser annealing system that includes the line-forming optical system of FIG. 1 as disclosed herein.

FIG. 6 is a schematic diagram of an example laser annealing system 100 that includes the line-forming optical system 10 disclosed herein. An example laser annealing system for which the line-forming optical system 10 is suitable for use is described in, for example, U.S. Pat. Nos. 7,612,372; 7,514,305; 7,494,942; 7,399,945; 7,154,066; 6,747,245; and 6,366,308.

The laser annealing system 100 of FIG. 6 includes, along the optical axis A1, the line-forming optical system 10 as described above, wherein the initial laser beam 22 emitted by the laser source 20 has a wavelength (e.g., nominally 10.6 microns from a $CO_2$ laser) that is absorbed by and is capable of heating the wafer W under select conditions. Such conditions include, for example, heating wafer W, or irradiating the wafer W with a second radiation beam (not shown) having a bandgap energy greater than the semiconductor bandgap energy of the wafer W, thereby causing the wafer W to absorb the second transmitted light 24P' to a degree sufficient to heat the wafer W to annealing temperatures. An example of irradiating the wafer W with a second laser source to make the wafer W absorbent to the second transmitted light 24P' is described in U.S. Pat. Nos. 7,098, 155, 7,148,159 and 7,482,254.

The wafer W is supported by a chuck 110 having an upper surface 112. In an example, the chuck 110 is configured to heat the wafer W. The chuck 110 in turn is supported by a stage 120 that in turn is supported by a platen 130. In an example embodiment, the chuck 110 is incorporated into the stage 120. In another example embodiment, the stage 120 is movable, including being translatable and rotatable.

The wafer W is shown by way of example as having device features in the form of source and drain regions 150S and 150D formed at or near the surface WS of wafer W as part of a circuit (e.g., transistor) 156 formed in the wafer W. Note that the relative sizes of the source and drain regions 150S and 150D in the circuit 156 compared to the wafer W are greatly exaggerated for ease of illustration. In practice, the source and drain regions 150S and 150D are very shallow, having a depth into the substrate of about one micron or less.

In an example embodiment, the laser annealing system 100 further includes a controller 170 electrically connected to the system 10 and to a stage controller 122. The stage controller 122 is electrically coupled to the stage 120 and is configured to control the movement of the stage 120 via instructions from the controller 170. The controller 170 is configured coupled to control the operation of laser annealing system 100 generally, and in particular the laser source 20, the stage controller 122.

In an example embodiment, the controller 170 is or includes a computer, such as a personal computer or workstation, available from any one of a number of well-known computer companies such as Dell Computer, Inc., of Austin Tex. The controller 170 preferably includes any of a number of commercially available micro-processors, a suitable bus architecture to connect the processor to a memory device, such as a hard disk drive, and suitable input and output devices (e.g., a keyboard and a display, respectively).

With continuing reference to FIG. 6, the second transmitted light 24P' generated as described above is directed onto the surface WS of wafer W to form the line image 80 thereon. It is noted that the term "image" is used herein in to generally denote the distribution of light formed by the second transmitted light beam 24P' at the image plane IP and the surface WS of wafer W residing therein.

In an example embodiment, the line image 80 is scanned over the surface WS of wafer W, as indicated by arrow 180, resulting in rapid heating of the surface WS of wafer W (down to a depth of about 1 micron or less) up to an annealing temperature (e.g., between 1000° C. and 1,300° C. for a non-melt process and in excess of the melt temperature of silicon of about 1,400° C. for a melt process) sufficient to activate dopants in the source and drain regions 150S and 150D, while also allowing for rapid cooling of the surface WS of wafer W so that the dopants do not substantially diffuse, thereby maintaining the shallowness of the source and drain regions 150S and 150D. Blanket dopant activation of the surface WS of wafer W can also be performed using the laser annealing system 100. A typical scan velocity of the line image 80 over the surface WS of wafer W ranges from 25 mm/sec to 1000 mm/sec. In an example, one or both of the second transmitted light 24P' and the wafer W can move during scanning.

Because the line-forming optical system 10 can form a relatively long line image 80 having a relatively large power density, the wafer W can be scanned much faster (e.g., up to 3× faster or have 3× longer process line for 3× throughput improvement) than previous line-forming optical systems would allow, thereby increasing the number of wafer per hour that can be processed by the laser annealing system 100.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of forming a line image, comprising:
forming a laser beam having a first intensity profile with a Gaussian distribution in at least a first direction;
passing at least 50% of the laser beam in the first direction to form a first transmitted light;
focusing the first transmitted light at an intermediate image plane to define a second intensity profile having a central peak and first side peaks immediately adjacent the central peak;
truncating the second intensity profile within each of first side peaks to define a second transmitted light; and
forming the line image at an image plane from the second transmitted light.

2. The method of claim 1, wherein each first side peak is defined by a maximum value MX and first and second minimum values m1 and m2, and wherein said truncating the second intensity profile is performed between the maximum value MX and the second minimum value m2 in each of the first side peaks.

3. The method of claim 1, wherein the intermediate image plane is defined by a relay optical system, and wherein the relay optical system has substantially 1× magnification in the first direction.

4. The method of claim 3, wherein the relay optical system comprises cylindrical mirrors.

5. The method of claim 3, wherein the relay optical system consists of reflective optical components only.

6. The method of claim 1, wherein the line image has a length L in the range of 5 mm≤L≤100 mm and has an intensity uniformity of within +/−5% over the length L.

7. The method of claim 1, wherein truncating the second intensity profile includes passing a central portion of the first transmitted light through a slit aperture defined by a pair of blades.

8. The method of claim 1, wherein the line image has a length L that is in the range of 5 mm≤L≤100 mm and has a width w in the range of 25 µm≤w≤500 µm.

9. The method of claim 1, wherein the line image has a long dimension defined by a length L, and further comprising scanning the line image over a surface of a wafer in a scan direction that is perpendicular to the long dimension.

10. The method of claim 9, wherein the surface of wafer includes device features that include dopants, and wherein scanning the line image over the surface of wafer activates the dopants.

\* \* \* \* \*